United States Patent
Van Haaren et al.

(10) Patent No.: US 7,057,488 B2
(45) Date of Patent: Jun. 6, 2006

(54) INTEGRATED INDUCTOR AND ELECTRONIC CIRCUIT INCORPORATING THE SAME

(75) Inventors: Bart Van Haaren, Le Touvet (FR); Cécile Clement, Grenoble (FR); Daniel Gloria, Grenoble (FR)

(73) Assignee: STMicroelectronics SA, Montrouge (FR)

( * ) Notice: Subject to any disclaimer, the term of this patent is extended or adjusted under 35 U.S.C. 154(b) by 111 days.

(21) Appl. No.: 10/774,055

(22) Filed: Feb. 6, 2004

(65) Prior Publication Data

US 2004/0217839 A1  Nov. 4, 2004

(51) Int. Cl.
*H01F 5/00* (2006.01)
(52) U.S. Cl. ............... 336/200; 336/223; 336/232; 29/602.1; 29/605
(58) Field of Classification Search .............. None
See application file for complete search history.

(56) References Cited

U.S. PATENT DOCUMENTS

| | | | |
|---|---|---|---|
| 6,320,491 B1 * | 11/2001 | Gevorgian et al. | 336/200 |
| 6,707,367 B1 * | 3/2004 | Castaneda et al. | 336/200 |
| 6,801,114 B1 * | 10/2004 | Yang et al. | 336/200 |
| 6,922,128 B1 * | 7/2005 | Vilander et al. | 336/200 |
| 6,924,725 B1 * | 8/2005 | Bueyuektas et al. | 336/223 |
| 6,940,386 B1 * | 9/2005 | Mukherjee et al. | 336/200 |

* cited by examiner

*Primary Examiner*—Anh Mai

(57) ABSTRACT

An integrated inductor comprises a first substantially plane conducting track made on the surface of a substrate and having a shape which defines a predetermined number N of concentric turns. A first pair of access points corresponds to the two respective ends of the said first conducting track. In addition, at least a second pair of access points different from the access points of the first pair, are placed at two respective regions of the first conducting track.

20 Claims, 1 Drawing Sheet

INTEGRATED INDUCTOR AND ELECTRONIC CIRCUIT INCORPORATING THE SAME

TECHNICAL FIELD OF THE INVENTION

The present invention relates generally to inductors used in integrated electronic components. More particularly, the present invention relates to a substantially plane integrated inductor made on the surface of a substrate.

BACKGROUND OF THE INVENTION

The cost of manufacturing an integrated electronic circuit comprising such an integrated inductor is strongly associated with the level of integration of the electronic elements forming it. In some applications, it is necessary to have available several inductance values in one and the same integrated circuit. Different inductors are then produced on the surface of the substrate, each one having a respective inductance.

A need exists in the art to increase the level of integration of the integrated circuit, and therefore to allow the manufacturing costs of such a circuit to be reduced in this type of application.

SUMMARY OF THE INVENTION

To address the above-discussed deficiencies of the prior art, a first aspect of the invention relates to an integrated inductor of the aforementioned type which further comprises at least a second pair of access points different from the access points of the first pair, and placed at two respective regions of the first conducting track.

As such, the first conducting track has respective inductance values between each pair of access points. For example, if it has two pairs of access points, it has a first inductance value between the first pair of access points and a second inductance value between the second pair of access points. An inductor according to the invention thus makes it possible advantageously to replace two inductors according to the prior art, or even more by increasing the number of pairs of access points.

In one advantageous embodiment, the shape of the first conducting track has an axial symmetry having as axis of symmetry the perpendicular bisector of the segment formed by the access points of the first pair of access points.

Preferably, the said axis of symmetry of the first conducting track is in addition the perpendicular bisector of the segment formed by the access points of the second pair of access points.

The portions of the first conducting track giving the first inductance value, or the first and second inductance values, thus have symmetrical geometry with respect to their respective pair of access points. Such inductance values may be used in differential structures, for example a differential oscillator or amplifier.

Preferably, the integrated inductor further comprises a second substantially straight conducting track having an axis coincident with the axis of symmetry of the first conducting track, and electrically connected to the first conducting track in a region corresponding to the middle of the extended length of the said first conducting track, together with a first additional access point corresponding to a first end of the second conducting track.

This first end, which then corresponds to the "mid-point" of the first inductance value, is for example placed between the access points of the first pair of access points (in the plane of the integrated inductor), and preferably in the middle.

In an advantageous embodiment, the integrated inductor further comprises a second additional access point corresponding to a second end of the second conducting track.

This second end, which corresponds to the "mid-point" of the second inductance value, is for example placed between the access points of the second pair of access points (in the plane of the integrated inductor), and preferably in the middle.

In an exemplary embodiment, the access points of the second pair of access points are located respectively at approximately one quarter and three quarters of the extended length (in the plane of the integrated inductor) of the first conducting track.

The inductance value between the access points of the first pair of access points is then close to twice the inductance value between the access points of the second pair of access points.

In preferred embodiments of the invention, one and/or other of the following arrangements may optionally be used:

the turns of the first conducting track are polygonal.

the turns of the first conducting track are octagonal.

A second aspect of the invention relates to an integrated electronic circuit which comprises an integrated inductor according to the first aspect.

A third aspect of the invention relates to an integrated electronic circuit which comprises an integrated inductor according to the first aspect and means for applying currents in phase opposition respectively to each of the access points of the first pair of access points, and/or means for applying currents in phase opposition respectively to each of the access points of the second pair of access points, the first additional access point and/or the second additional access point being taken to a neutral electrical potential, typically earth.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; and the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

Other features and advantages of the present invention will become apparent during the following description of one of its embodiments, given by way of non-limiting example, with reference to the appended drawings, in which like reference numerals represent like parts, and in which.

DETAILED DESCRIPTION OF THE INVENTION

Figure 1:
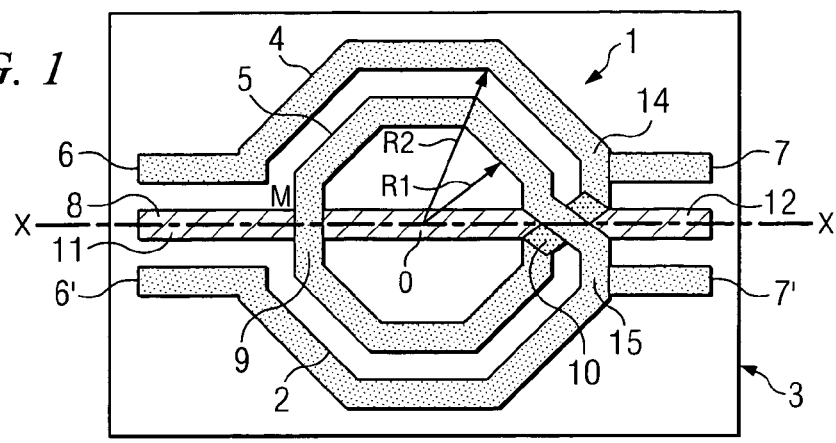
FIG. 1 is a top view of a first embodiment of an integrated inductor according to the invention.
Figure 2:
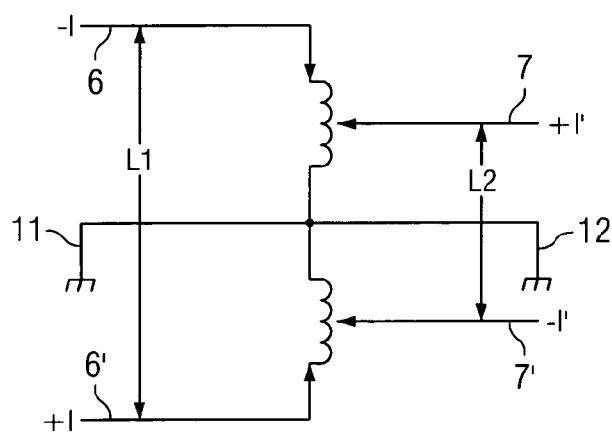
FIG. 2 is the corresponding circuit diagram of an integrated inductor according to the invention.
Figure 3:
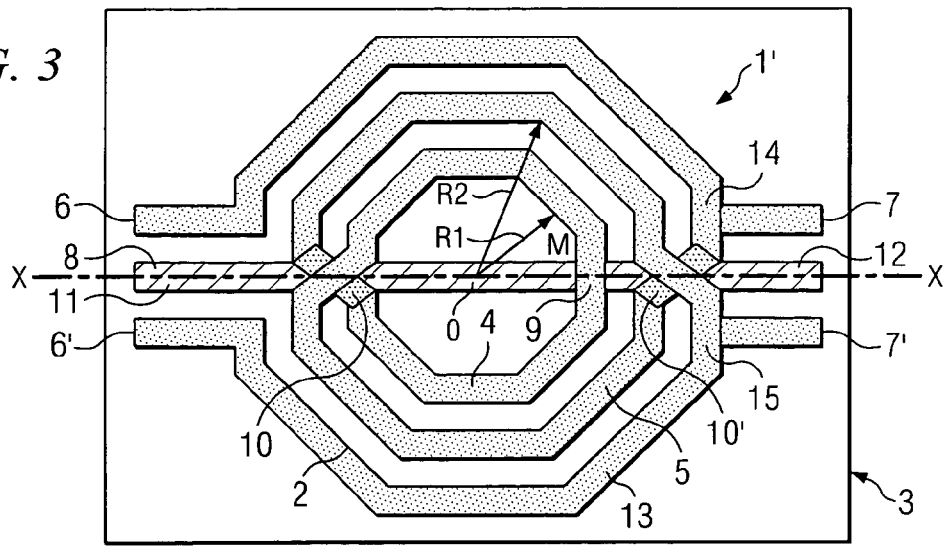
FIG. 3 is a top view of a second embodiment of an integrated inductor according to the invention.

FIGS. 1 through 3, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged inductors used in integrated electronic components.

FIG. 1 shows a top view of an integrated inductor 1, in a first embodiment of the invention. This inductor 1 is made on the surface of a substrate 3, according to techniques known to a person skilled in the art. The inductor 1 is substantially plane. For the sake of simplicity, in the present account of the invention, the geometry of the inductor 1 is described in a two-dimensional manner by considering a single plane corresponding to the surface of the substrate 3. Of course, various parts of the inductor are in general, and in a manner known per se, made in respective metallization levels.

The inductor 1 comprises a first conducting track 2. This track lies, for example, in a determined metallization level (corresponding to the plane of the figure), made above a semiconductor substrate.

In the example corresponding to FIG. 1, the track 2 forms two concentric turns 4 and 5 having centre O and radius R1 and R2, respectively. Here, these radii are measured from the inner edge of the track 2. The turns are preferably of polygonal shape. Here, they are of octagonal shape. Furthermore, the track 2 has an axial symmetry with respect to an axis X—X passing through the centre O of the turns. Passage from the turn 4 to the turn 5 without contact between the two turns takes place by inserting an air bridge 10 or "underpass", in another metallization level, which is below the plane of the figure in the example shown but which may also be above this plane.

The inductor 1 comprises a first pair of access points 6 and 6' corresponding to the ends of the track 2. Preferably, these points are arranged symmetrically on each side of the axis X—X. The track 2 has an inductance value L1 between the pair of access points 6 and 6'.

The inductor 1 further comprises another pair of access points 7 and 7' placed at two regions 14 and 15 respectively of the conducting track 2. The track 2 has an inductance value L2 between the access points 7 and 7'.

In the exemplary embodiment of the invention in question, the access points 7 and 7' are placed symmetrically on each side of the axis X—X. In other words, this axis is also the perpendicular bisector of the segment formed by the points 7 and 7', such that the geometry of the inductor 1 is symmetrical with respect to the axis X–X'. Furthermore, the points 7 and 7' are located respectively at approximately a quarter and three quarters of the extended length of the track 2. Thus L1 is close to twice L2.

Furthermore, the inductor 1 may comprise a second track 8 which, in the embodiment shown, is straight. The track 8 is located, in the example shown, in a metallization level below the plane of FIG. 1. If the plane of the inductor 1 is considered overall, it can be said that the track 8 lies along the axis X—X. In this sense, it can be said that the longitudinal axis of the track 8 coincides with the axis of symmetry X–X' of the track 2 in the plane thereof.

The track 8 is electrically connected to the first track 2 in a region M corresponding to the middle of the extended length of the conducting track 2. This electrical connection takes place, for example, by means of an electrical connection 9 (or via) arranged perpendicularly to the plane of the track 2. This region M therefore corresponds to the middle of the portion of track between the access points 6 and 6', and to the middle of the portion of track between the access points 7 and 7'.

The second track 8 comprises two ends 11 and 12, one and/or other of which correspond(s) to respective additional access points of the inductor 1. These access points 11 and 12 are arranged such that the orthogonal projection of the access point 11 onto the plane of the track 2 is located between, and preferably in the middle of, the pair of access points 6 and 6', and such that the orthogonal projection of the access point 12 onto the plane of the track 2 is located between, and preferably in the middle of, the pair of access points 7 and 7'.

FIG. 2 shows a circuit diagram equivalent to the use in differential mode of the inductance values L1 and L2 of the inductor 1. It will be recalled that the inductor 1 has, between the access points 6 and 6', the inductance value L1 and a central access point 11. It also has, between the access points 7 and 7', an inductance value L2 and a central access point 12. These central access points 11 and 12 are typically connected to a neutral potential such as earth and currents +I and −I are applied in phase opposition respectively to each of the access points 6 and 6', and currents +I' and −I' are applied in phase opposition respectively to each of the access points 7 and 7'.

An integrated inductor of the inductor type shown in FIGS. 1 and 2 and described above, with the inductance value L1 greater than the inductance value L2, may for example be used in order to produce an integrated circuit of the multiband VCO (Voltage Controlled Oscillator) type in differential mode, equivalent to two VCOs at different frequencies (in this case, about double), for example 1.8 GHz and 0.9 GHz.

Thus, the invention effectively makes it possible to increase the level of integration of an integrated circuit and therefore to reduce the cost of manufacturing such a circuit.

FIG. 3 shows a top view of an integrated inductor 1' according to another embodiment of the invention. The inductor 1' shown in FIG. 3 differs from the inductor 1 shown in FIG. 1 in that the track 2 comprises not two but three concentric turns 4, 5 and 13, in this case, of octagonal shape. Passage of the track 2 from the turn 4 to the turn 5 without contact between the two turns takes place by inserting an air bridge 10. In the same way, passage of the track 2 from the turn 5 to the turn 13 without contact between the two turns takes place by inserting an air bridge 10'. These air bridges 10 and 10' are located in other metallization levels, which are below the plane of the figure in the example shown, but which may also be above.

The inductor 1' still comprises a first pair of access points 6 and 6' corresponding to the ends of the track 2 and placed symmetrically on each side of the axis X—X. The track 2 has an inductance value L1 between the pair of access points 6 and 6'.

The inductor 1' still comprises another pair of access points 7 and 7' placed at two respective regions 14 and 15 of the conducting track 2. The track 2 has an inductance value L2 between the access points 7 and 7'.

In the exemplary embodiment of the invention considered in FIG. 3, the access points 7 and 7' are still arranged symmetrically on each side of the axis X—X. However, they are located respectively at about one fifth and four-fifths of the extended length of the conducting track 2. Thus the inductance value L2 is close to three fifths of the inductance value L1.

As in the case of the inductor 1 shown in FIG. 1, the inductor 1' further comprises a second track 8 which comprises two ends corresponding to two additional access points 11 and 12, arranged in the same way as in FIG. 1. The track 8 is electrically connected by means of an electrical connection 9 to the centre of the conducting track 2 in a region M which corresponds to the middle of the portion of track between the access points 6 and 6', and to the middle of the portion of track between the access points 7 and 7'.

What is claimed is:

1. A substantially planar integrated inductor made on a surface of a substrate, comprising:
    a first conducting track having a shape which defines a predetermined number N of concentric turns;
    a first pair of access points corresponding to the two respective ends of the first conducting track;
    at least a second pair of access points different from the access points of the first pair, wherein the second pair of access points are placed at two respective regions of the first conducting track; and
    a second, substantially straight, conducting track having an axis coincident with the axis of symmetry of the first conducting track, and electrically connected to the first conducting track in a region corresponding to the middle of the extended length of the first conducting track, together with a first additional access point corresponding to a first end of the second conducting track.

2. The integrated inductor according to claim 1, wherein the shape of the first conducting track has an axial symmetry of a determined axis, the determined axis being a perpendicular bisector of a segment formed by the access points of the first pair of access points.

3. The integrated inductor according to claim 2, wherein the axis of symmetry of the first conducting track is in addition a perpendicular bisector of a segment formed by the access points of the second pair of access points.

4. The integrated inductor according to claim 1, wherein the access points of the second pair of access points are located respectively at approximately one fifth and four fifths of the extended length of the first conducting track.

5. The integrated inductor according to claim 1, further comprising a second additional access point corresponding to a second end of the second conducting track.

6. The integrated inductor according to claim 1, wherein the access points of the second pair of access points are located respectively at approximately one quarter and three quarters of the extended length of the first conducting track.

7. The integrated inductor according to claim 1, wherein the turns of the first conducting track are polygonal.

8. The integrated inductor according to claim 7, wherein the turns of the first conducting track are octagonal.

9. An integrated electronic circuit comprising:
    a substantially planar integrated inductor made on a surface of a substrate, comprising a first conducting track having a shape which defines a predetermined number N of concentric turns;
    a first pair of access points corresponding to the two respective ends of the said first conducting track;
    at least a second pair of access points different from the access points of the first pair, wherein the second pair of access points are placed at two respective regions of the first conducting track; and
    a second, substantially straight, conducting track having an axis coincident with the axis of symmetry of the first conducting track, and electrically connected to the first conducting track in a region corresponding to the middle of the extended length of the first conducting track, together with a first additional access point corresponding to a first end of the second conducting track.

10. The integrated electronic circuit according to claim 9, wherein the shape of the first conducting track has an axial symmetry of a determined axis, the determined axis being a perpendicular bisector of a segment formed by the access points of the first pair of access points.

11. The integrated electronic circuit according to claim 10, wherein the axis of symmetry of the first conducting track is in addition a perpendicular bisector of a segment formed by the access points of the second pair of access points.

12. The integrated electronic circuit according to claim 9, wherein the access points of the second pair of access points are located respectively at approximately one fifth and four fifths of the extended length of the first conducting track.

13. The integrated electronic circuit according to claim 12, further comprising a second additional access point corresponding to a second end of the second conducting track.

14. The integrated electronic circuit according to claim 13, further comprising:
    means for applying currents in phase opposition respectively to each of the access points of the first pair of access points; and
    means for applying currents in phase opposition respectively to each of the access points of at least one of a second pair of access points,
    wherein the first additional access point and the second additional access point are electrically connected to a neutral electrical potential.

15. The integrated electronic circuit according to claim 9, wherein the turns of the first conducting track are polygonal.

16. A method of forming an integrated inductor on the surface of a substrate, comprising the steps of:
    forming a first conducting track having a shape which defines a predetermined number N of concentric turns;
    creating a first pair of access points electrically connected to the two respective ends of the first conducting track;
    creating at least a second pair of access points electrically connected to two respective regions of the first conducting track;
    forming a second, substantially straight, conducting track having an axis coincident with the axis of symmetry of the first conducting track; and
    electrically connecting the second conducting track to the first conducting track in a region corresponding to the middle of the extended length of the first conducting track.

17. The method of claim 16, wherein the shape of the first conducting track has an axial symmetry of a determined axis, the determined axis being both a perpendicular bisector of a segment formed by the access points of the first pair of access points and a perpendicular bisector of a segment formed by the access points of the second pair of access points.

18. The method of claim 17, wherein the access points of the second pair of access points are located respectively at approximately one fifth and four fifths of the extended length of the first conducting track.

19. The method of claim 18, further comprising the steps of:
- creating a first additional access point at a first end of the second conducting track; and
- creating a second additional access point at a second end of the second conducting track.

20. The method of claim 19, further comprising the steps of:
- electrically connecting each of the access points of the first pair of access points to a first source of currents in phase opposition;
- electrically connecting each of the access points of the second pair of access points to a second source of currents in phase opposition; and
- electrically connecting the first additional access point and the second additional access point to a neutral electrical potential.

* * * * *